United States Patent
Wen et al.

(10) Patent No.: US 7,638,376 B2
(45) Date of Patent: Dec. 29, 2009

(54) METHOD FOR FORMING SOI DEVICE

(75) Inventors: Cheng-Kuo Wen, Hsinchu (TW);
Chien-Chao Huang, Hsinchu (TW);
Hao-Yu Chen, Kaohsiung (TW);
Fu-Liang Yang, Hsinchu (TW);
Hsun-Chih Tsao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 106 days.

(21) Appl. No.: 11/652,624

(22) Filed: Jan. 12, 2007

(65) Prior Publication Data

US 2008/0171419 A1    Jul. 17, 2008

(51) Int. Cl.
*H01L 21/00* (2006.01)
*H01L 21/84* (2006.01)

(52) U.S. Cl. .............. 438/164; 438/154; 438/161; 438/311; 438/620; 257/347; 257/349; 257/E27.112

(58) Field of Classification Search .......... 438/154, 438/161, 164, 311, 620; 257/347, 349, E27.112
See application file for complete search history.

(56) References Cited

U.S. PATENT DOCUMENTS

| | | | |
|---|---|---|---|
| 5,236,863 A * | 8/1993 | Iranmanesh | 438/429 |
| 5,314,841 A | 5/1994 | Brady et al. | |
| 5,569,621 A * | 10/1996 | Yallup et al. | 438/404 |
| 6,300,666 B1 | 10/2001 | Fechner et al. | |
| 6,372,562 B1 * | 4/2002 | Matsumoto | 438/164 |
| 6,413,857 B1 * | 7/2002 | Subramanian et al. | 438/638 |
| 6,436,744 B1 * | 8/2002 | Bryant et al. | 438/151 |
| 6,521,947 B1 | 2/2003 | Ajmera et al. | |
| 6,596,592 B2 * | 7/2003 | Bertin et al. | 438/270 |
| 6,611,024 B2 * | 8/2003 | Ang et al. | 257/350 |
| 6,649,457 B2 * | 11/2003 | Hsu | 438/154 |
| 6,653,221 B1 * | 11/2003 | Subramanian et al. | 438/620 |
| 6,969,676 B2 * | 11/2005 | Schwan et al. | 438/637 |
| 7,205,190 B2 * | 4/2007 | Okihara | 438/233 |
| 2004/0241917 A1 * | 12/2004 | Schwan et al. | 438/151 |
| 2007/0262411 A1 * | 11/2007 | Rauscher | 257/506 |
| 2008/0283960 A1 * | 11/2008 | Lerner | 257/508 |

* cited by examiner

*Primary Examiner*—Matthew Smith
*Assistant Examiner*—John M Parker
(74) *Attorney, Agent, or Firm*—Birch, Stewart, Kolasch & Birch, LLP

(57) ABSTRACT

A method for forming a substrate contact on a silicon-on-insulator (SOI) wafer is provided that can be integrated with a process for fabricating SOI devices without additional processing after wafer dicing. The method is applicable in many of the more advanced packaging technologies, e.g., such as flip chip and die stacking, directly creating a contact to silicon substrate via the front of the diced SOI wafer.

22 Claims, 11 Drawing Sheets

METHOD FOR FORMING SOI DEVICE

BACKGROUND OF THE INVENTION

1. Field of the Invention

The invention relates to device processing of silicon-on-insulator (SOI) wafers, and in particular to methods of forming SOI device with a front side contact to the underlying substrate of a SOI wafer.

2. Description of the Related Art

SOI technology has been shown to have many advantages over bulk silicon technology. These advantages include higher speed, low power and resistance to certain forms of radiation.

In many applications it is desirable to ground or bias the bottom substrate of a SOI circuit to prevent static charge build-up therein during normal chip operation. Static charge build-up may cause a back channel disturbing normal operation of SOI devices and creation of an electrical contact at the backside of the wafer requires additional wafer processing. In many of the more advanced packaging technologies, e.g., such as flip chip and die stacking, creating a contact to substrate silicon via the back of the die is prohibitive. Therefore, the present inventors have determined that there is a need for a method of forming SOI device incorporating with at least one substrate contact contacting the substrate from the front side of a SOI wafer to allow biasing of the substrate through the electrically isolated buried oxide layer.

Ajmera et al., in U.S. Pat. No. 6,521,947, the entirety of which is hereby incorporated by reference, describe a method which includes the step of forming a contact trench in the substrate through the filled shallow isolation trench and silicon on insulator substrate region extending down at least to the top of a silicon substrate underlying the silicon on insulator region.

Fechner et al., in U.S. Pat. No. 6,300,666, the entirety of which is hereby incorporated by reference, describe a method which includes the step of forming a front side substrate contact on a silicon-on-insulator wafer in the presence of planarized contact dielectric for reducing the etching selectivity requirement, while allowing simultaneous etching and metallization of gate, source, drain and substrate contacts.

Brady et al., in U.S. Pat. No. 5,314,841, the entirety of which is hereby incorporated by reference, describe a method that includes contacting a front side to a SOI wafer. However, a trench is etched through the SOI layers to the substrate before any device-processing step. This trench is maintained during device processing and opened during source/drain implantation. An ohmic contact is made to the substrate when metallization thereof.

BRIEF SUMMARY OF THE INVENTION

The present invention overcomes the shortcomings associated with the background art and achieves other advantages not realized by the background art.

Accordingly, an object of the invention is to provide a novel method for forming a front side substrate contact of a SOI wafer.

Another object of the invention is to provide a method for forming a front side substrate contact capable of integration with an SOI device process adopting an isolation region technique.

One or more of these and other objects are accomplished by a method for forming a substrate contact on a SOI wafer according to an embodiment of the present invention. First, a SOI wafer with a mask layer thereon is provided, wherein the SOI wafer comprises an underlying substrate, and a silicon layer overlaying a buried insulating layer. An isolation region is then formed through the mask layer and the silicon layer. Next, a contact opening is formed through a central portion of the isolation region and the buried insulating layer thereunder to expose the underlying substrate. Next, a conductive plug is formed in the contact opening to electrically contact the underlying substrate, wherein the conductive plug is surrounded by the insulating layer and the buried insulating layer.

One or more of these and other objects are accomplished by a method for forming a silicon-on-insulator (SOI) device, said method comprising the steps of providing a SOI wafer with a mask layer thereon, wherein the SOI wafer includes an underlying substrate, and a silicon layer overlaying a buried insulating layer; forming an isolation region through the mask layer and the silicon layer; forming a contact opening through a central portion of the isolation region and the buried insulating layer thereunder to expose the underlying substrate; and forming a contact plug in the contact opening to electrically connect the underlying substrate, wherein the contact plug is surrounded by the isolation region and the buried insulating layer.

One or more of these and other objects are accomplished by a method for forming a silicon-on-insulator (SOI) device, comprising the steps of providing a SOI wafer with a mask layer thereon, wherein the SOI wafer includes an underlying substrate and a silicon layer overlaying a buried insulating layer; defining the mask layer and the silicon layer to form a plurality of first openings exposing the buried insulating layer therein, thereby forming a plurality of isolated silicon mesas over the SOI wafer; defining a central region of the buried insulating layer exposed by the first opening, thereby form a second opening exposing the underlying substrate therein; forming a conductive plug in the second opening to electrically contact the underlying substrate, wherein the conductive plug is surrounded by the buried insulating layer and the insulating layer; removing the mask layer and exposing the isolated silicon mesas; forming a dielectric layer over each of the isolated silicon mesas; forming a conductive layer over at least one of the isolated silicon mesas, partially covering the dielectric layer; and forming a pair of source/drain regions in one of the isolated silicon mesa not covered by the conductive layer.

One or more of these and other objects are accomplished by a method for forming a silicon-on-insulator (SOI) device, said method comprising the steps of providing a SOI wafer, wherein the SOI wafer includes an underlying substrate and a silicon layer overlaying a buried insulating layer; defining the silicon layer into a plurality of isolated silicon mesas, leaving a gap between every two adjacent isolated silicon mesas; forming a dielectric layer over each of the isolated silicon mesas, covering top and sidewall surfaces thereof, forming a conductive layer over at least one of the isolated silicon mesas, partially covering the dielectric layer from top and sidewall surface thereof; forming a pair of source/drain regions in one of the isolated silicon mesa not covered by the conductive layer, thereby forming a transistor; blanketly forming an insulating layer over the SOI wafer, covering the transistor and gaps between the isolated silicon mesas; forming an first opening in the insulating layer, wherein the first opening substantially aligns to one of the gaps between the isolated silicon mesas and forms through the buried insulating layer thereunder, thereby exposing the underlying substrate therein; and forming a conductive plug in the first opening to electrically contact the underlying substrate, wherein the conductive plug is surrounded by the buried insulating layer and the insulating layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
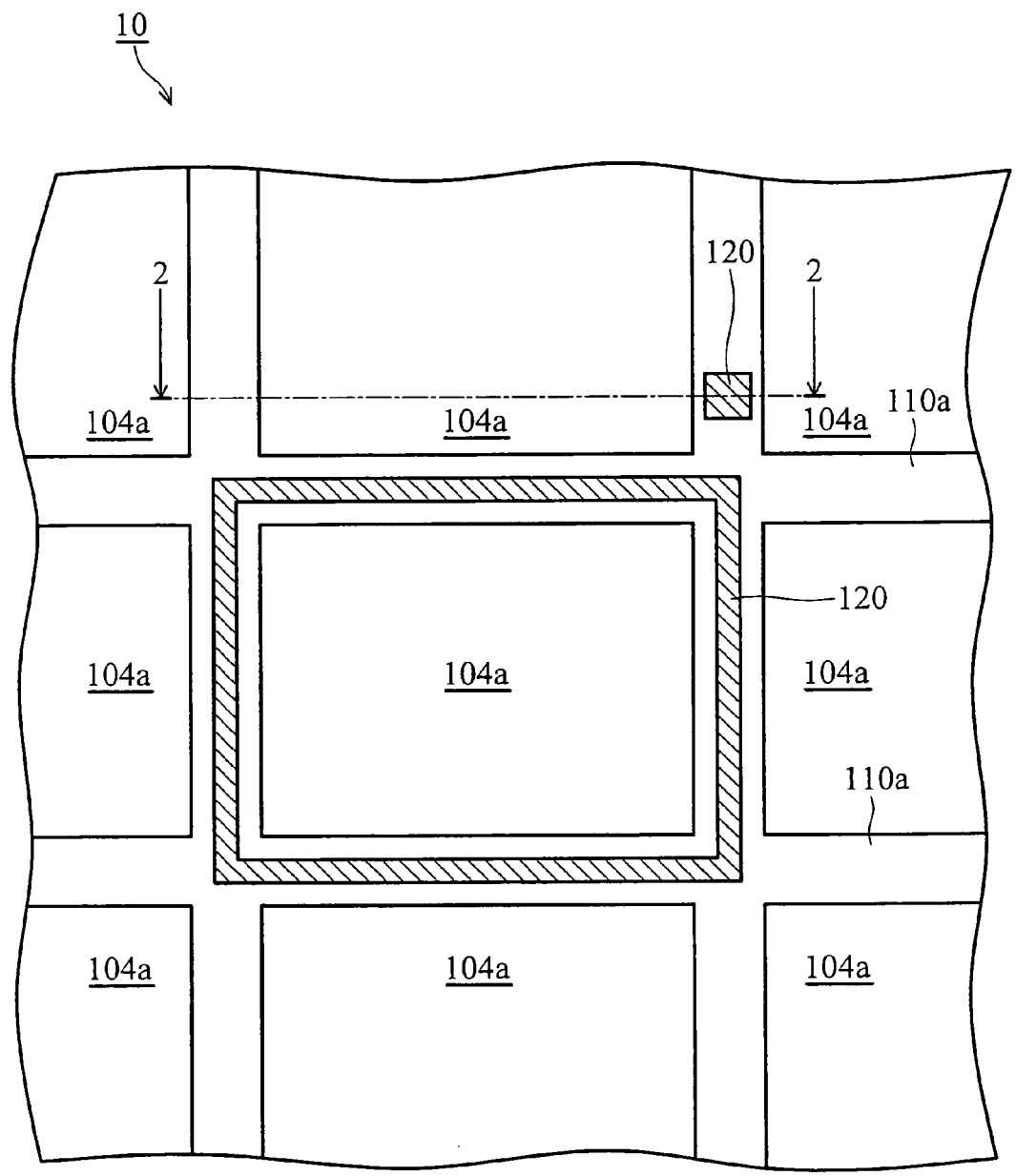
FIG. 1 is a plan view showing a SOI wafer having a front side substrate contacts according to an embodiment of the present invention.
Figure 3:
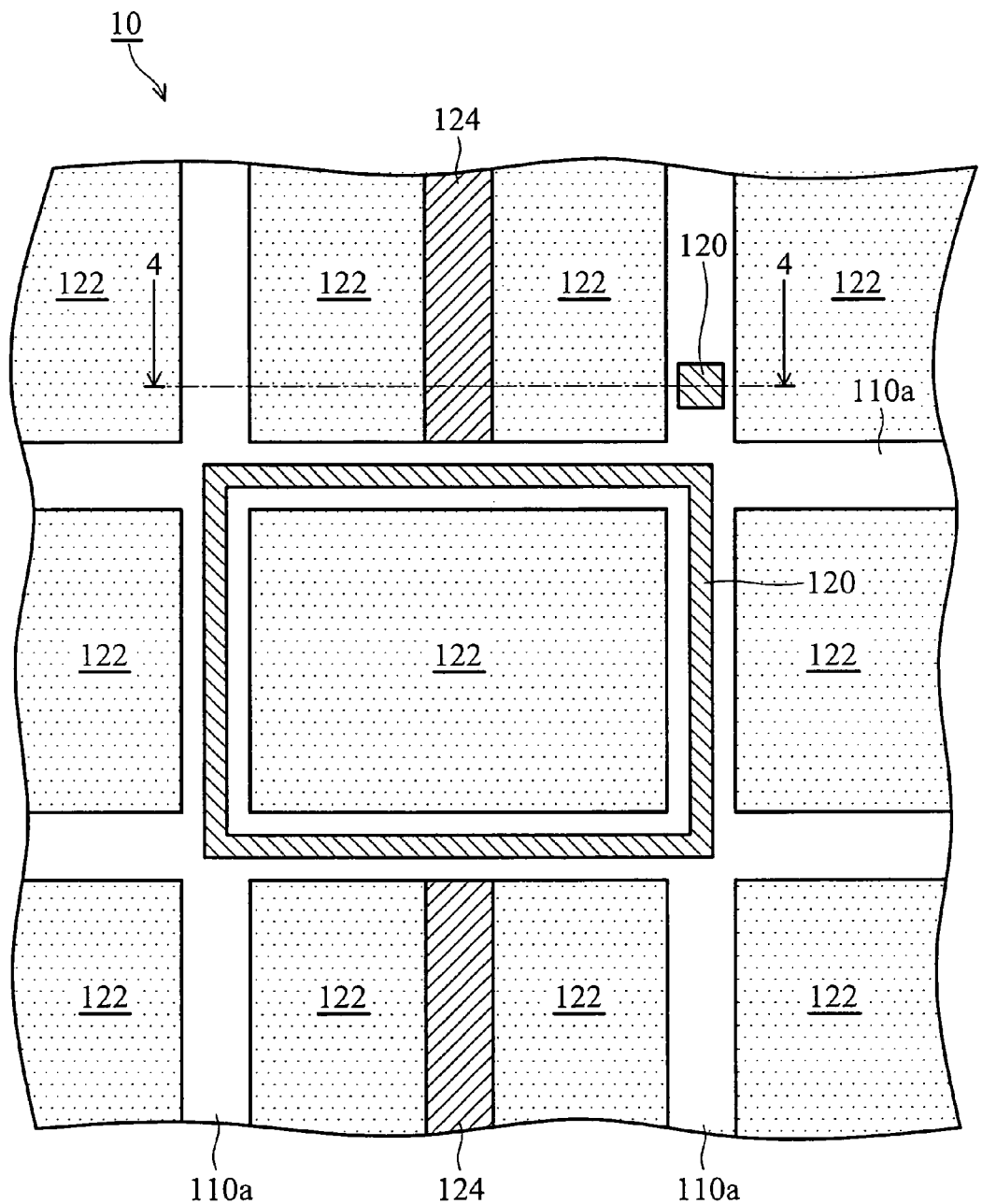
FIG. 3 is a plan view showing a SOI wafer having a front side substrate contacts and a plurality of SOI devices according to an embodiment of the present invention.

The present invention will hereinafter be described with reference to the accompanying drawings. FIGS. 1 and 3 are schematic plan views showing a method for forming a silicon-on-insulator (SOI) device according to an embodiment of the present invention. FIG. 1 is a plan view showing a SOI wafer 10 with front side substrate contact according to an embodiment of the present invention. In this embodiment, substrate contact, i.e., the conductive layer 120, of the SOI wafer 10 is formed within an isolation region, i.e., the second insulating layer 110a, for insulating each silicon mesa 104a and is surrounded by the isolation region. The substrate contact can be defined by a ring or opening surrounded by the isolation region, i.e. the region including the second insulating layer 110a. FIG. 3 is a plan view showing the SOI wafer 10 with front side substrate contact and SOI device formed thereover according to an embodiment of the present invention. In this embodiment, SOI devices, for example metal-oxide-semiconductor (MOS) transistors, are provided over some silicon mesas 104a illustrated in FIG. 1, each comprising a dielectric layer 122 and a conductive layer 124 sequentially stacked thereover. As shown in FIG. 3, the dielectric layer 122 is selectively formed over each of the silicon mesas 104a and the conductive layer 124 is formed over some of the silicon mesas 104a, partially covering the dielectric layer 122 thereover.

Figure 2A:
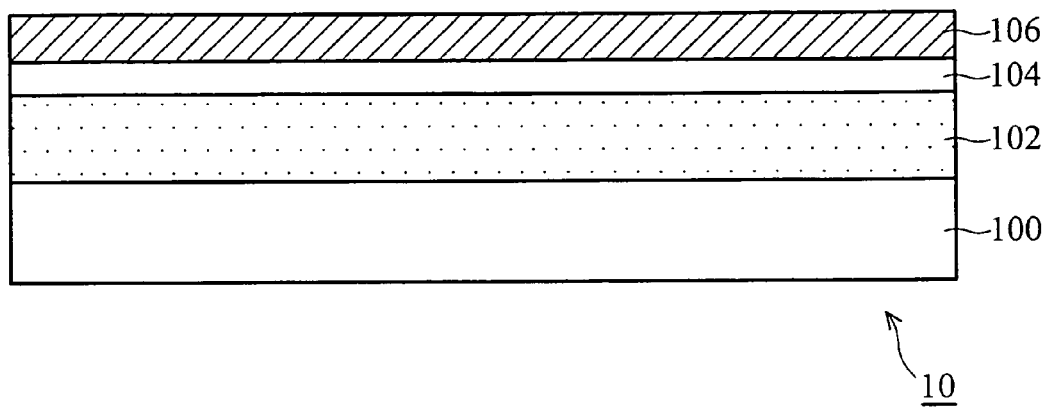
FIGS. 2a-2d are cross-sectional views taken along line 2-2 in FIG. 1, showing a fabrication steps for forming a front side substrate contact according to an embodiment of the present invention.

The method for forming the silicon-on-insulator device is further illustrated by the cross-sectional views shown in FIGS. 2a-2d and 4. In FIG. 2a, a SOI wafer 10 with a mask layer 106 thereon is provided, wherein the SOI wafer 10 includes an underlying substrate 100, and a silicon layer 104 overlaying a buried insulating layer 102, e.g., a buried oxide layer. The material of the mask layer 106 can be oxide, nitride, or a combination thereof. Exemplary thicknesses of the mask layer 106, the silicon layer 104, and the buried insulating layer 102 are approximately 50-5000 Å, 50-1000 Å, and 50-10000 Å, respectively.

Figure 2B:
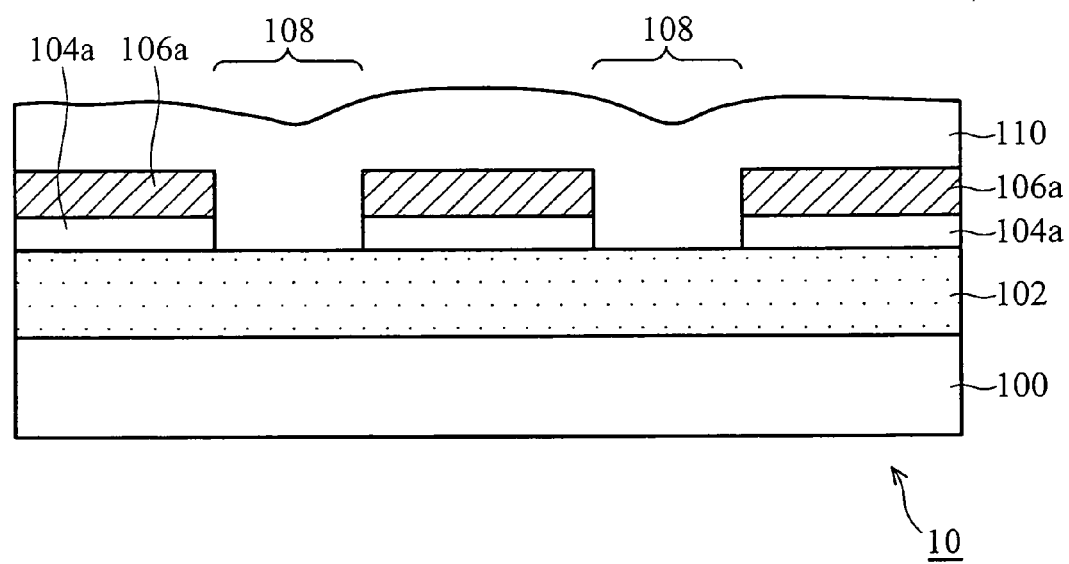

In FIG. 2b, the mask layer 106 and the silicon layer 104 are then defined by photolithography and sequential etching to form a plurality of first openings 108, exposing the buried insulating layer 102 therein. A plurality of isolated silicon mesas 104a with patterned mask layer 106a thereon is formed as shown in FIG. 2b. Next, an insulating layer 110, e.g., an oxide layer, is formed over the SOI wafer 10 and fills or blankets each first opening 108 and the SOI wafer 10.

Figure 2C:
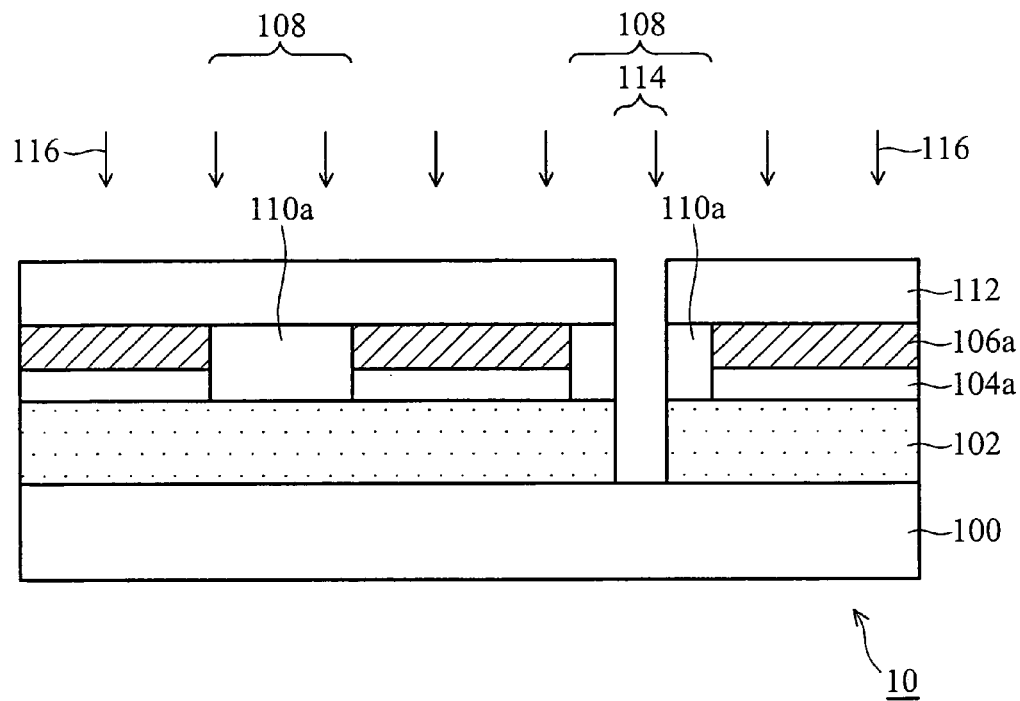

In FIG. 2c, the portion of the insulating layer 110 over the patterned mask layer 106a is then removed to leave the insulating layer 110a in each first opening 108 as device isolations, e.g., thus forming an isolation region in each first opening 108. Further, the top surface of the SOI wafer 10 is planarized during the described removal of the portion of the insulating layer 10. In a preferred embodiment, the method for planarizing the SOI wafer can be chemical mechanical polishing (CMP) or an etching back process.

Next, a photoresist (PR) layer 112 is formed on the SOI wafer 10 and then patterned by a subsequent photolithography, e.g., thus forming a patterned photoresist layer 112 exposing a central region of one of the insulating layers 110a. An etching process, such as dry etching of the exposed insulating layer 110a and the buried insulating layer 102 thereunder is then performed using the patterned photoresist layer 112a as an etching mask and stop on the underlying substrate 100, e.g., thus forming a second opening 114 exposing the underlying substrate 100 therein. Here, the second opening 114 has an aspect ratio of approximately 3:1 to 20:1. The etchants for use in the etching process for forming the second opening 114 may include N2, H2 and F based materials to provide better isotropic etching performance.

Typically, but not necessarily, a subsequent ion implantation 116 is performed to implant dopants of the same conductive type as that in the underlying substrate 100. Normally, the underlying substrate 110 is a p-type doped silicon substrate and the ions used in the ion implantation 116 can be p-type dopants, e.g., such as boron or indium.

Figure 2D:
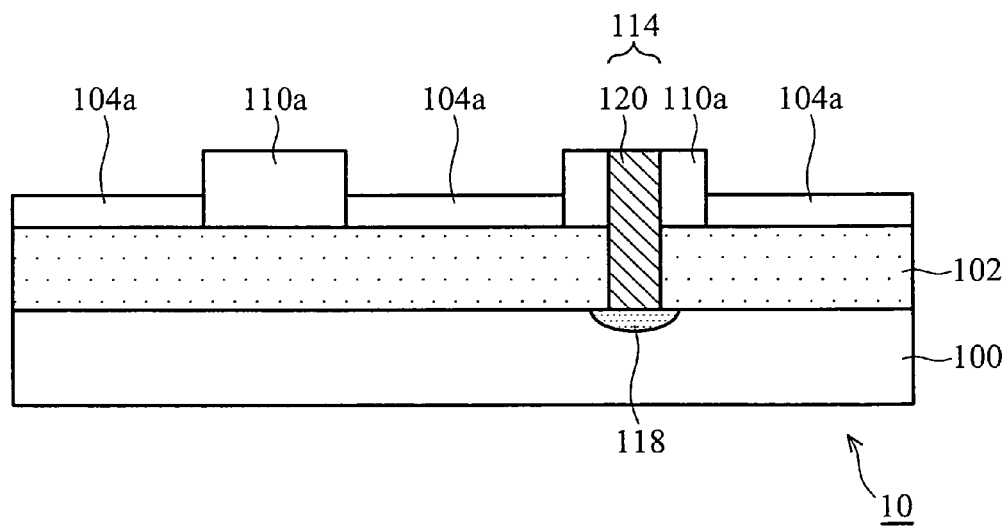

In FIG. 2d, after removal of the patterned photoresist layer 112, a subsequent annealing process is then performed to form a doped region 118 in the underlying substrate 110 exposed by the second opening 114. Next, a conductive plug 120 of electrically conductive material, e.g., such as metal or doped polysilicon, is formed in the second opening 114 to electrically contact the underlying substrate 110. The conductive plug 120 is insulated and surrounded by the adjacent insulating layer 110a and the buried insulating layer 102. The conductive plug 120 is formed by first forming a blanket layer of conductive material over the SOI wafer 10 that fills the second opening 114, and then removing the portion of conductive material over the patterned mask layer 106a.

Figure 4:
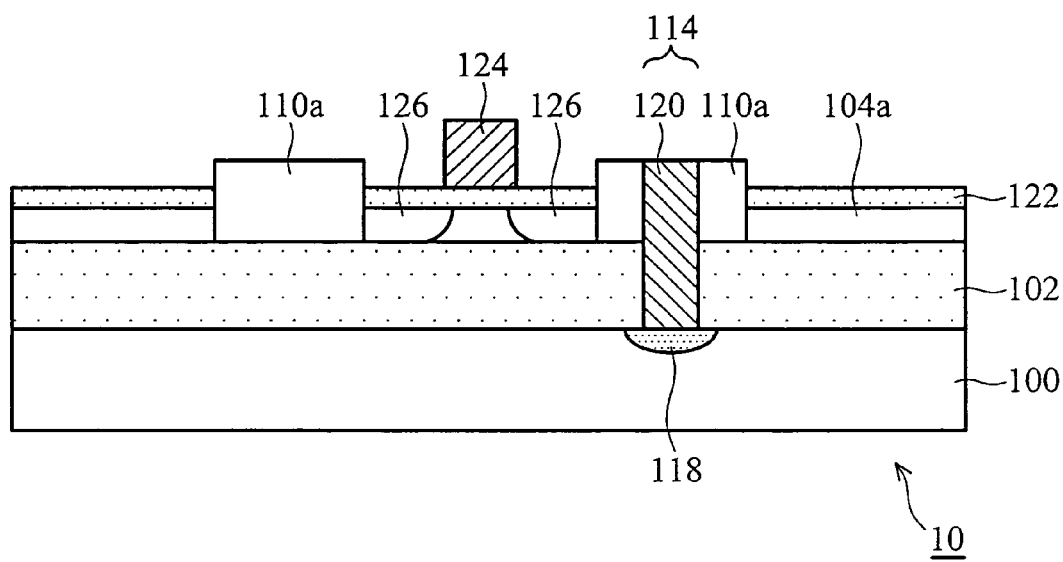
FIG. 4 is a cross-sectional view taken along line 4-4 in FIG. 3, showing fabrication steps for forming a SOI device according to an embodiment of the present invention.

Next, the patterned mask layer 106a is removed by an etching step, e.g., such as wet etching to form a SOI wafer 10 with a plurality of isolated silicon mesas 104a and at least one substrate contact (i.e. the conductive plug 120) disposed in the front side of the SOI wafer. SOI devices such as the MOS transistor shown in FIG. 3 can be then fabricated on some of the isolated mesas by conventional semiconductor fabricating techniques and the conductive plug 120 functioning as a front side substrate contact can further electrically contact with a conductive wire (not shown) subsequently formed in the upper level for providing voltages for grounding or biasing the underlying substrate 100. FIG. 4 shows a cross-sectional view taken along line 4-4 in FIG. 3. In FIG. 4, the MOS transistor is formed on one of the silicon mesas 104a and the dielectric layer 126 is formed over each of the silicon mesas 104a. The conductive layer 124 is formed over a portion of the dielectric layer 124. Source/drain regions 126 are formed in portions of one of the silicon mesa 104a, thereby functioning as an SOI device.

Although not required in all embodiments, in a preferred embodiment the substrate contact contacts the underlying substrate 100 by the doped region 118 of same doping type as that of the underlying substrate 100 as shown in FIGS. 1 and 3. The doping region 118 allows an ohmic contact to the SOI wafer 10.

In an embodiment of the present invention, the front side substrate contact is formed prior to the formation of the SOI device formed over the silicon mesas with fewer layers existing on the SOI wafer. Etching for forming the contact opening and the filling of the conductive layer are thus easily achieved due to the low aspect ratio, e.g., approximately 20:1 to 3:1 of the contact opening.

Figure 5:
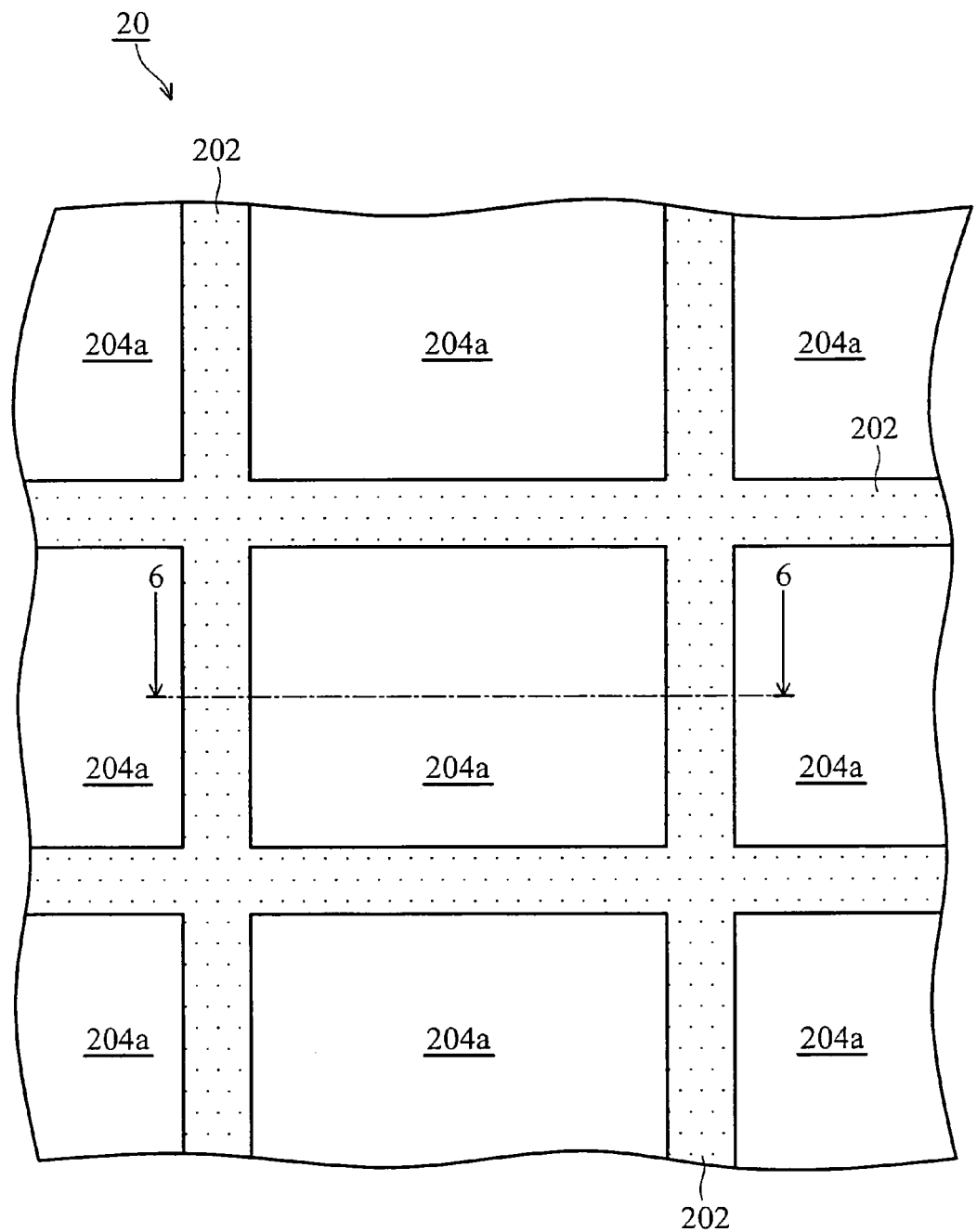
FIG. 5 is a plan view showing a SOI wafer having a plurality of isolated silicon mesas thereon according to an embodiment of the present invention.
Figure 7:
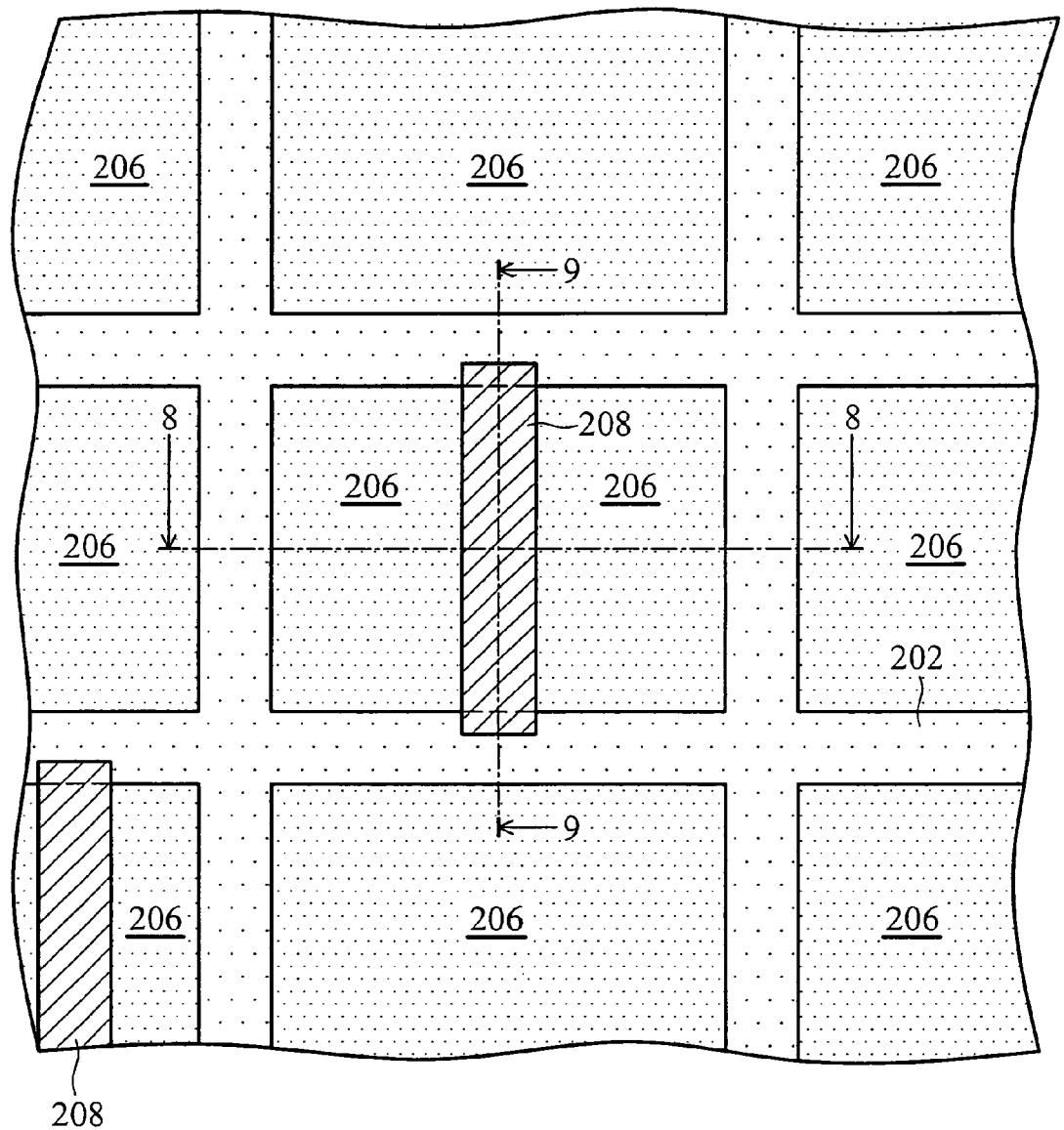
FIG. 7 is a plan view showing a SOI wafer having a plurality of SOI devices thereon according to an embodiment of the present invention.
Figure 10:
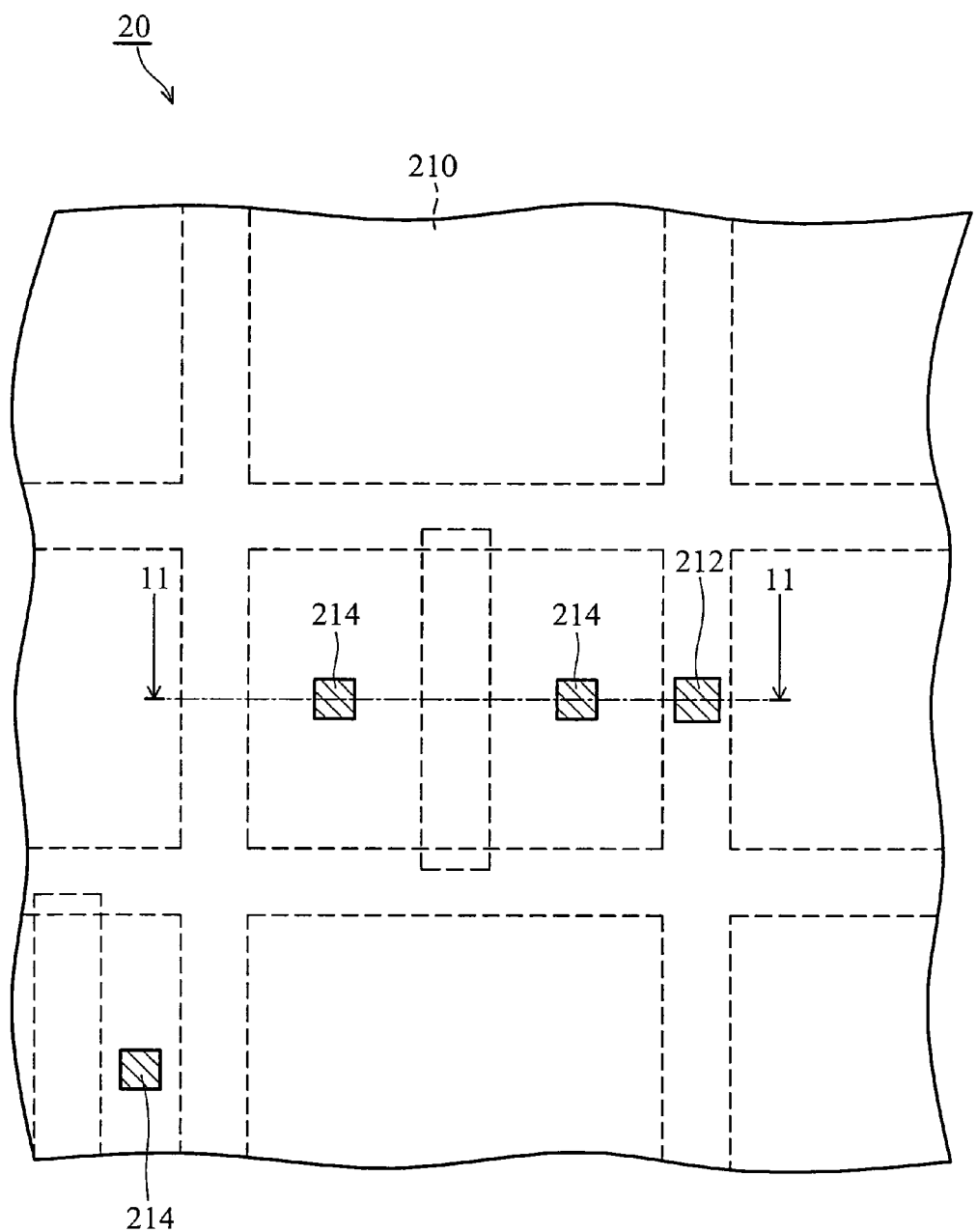
FIG. 10 is a plan view showing a SOI wafer having a plurality of SOI devices and a front side substrate contact thereon according to an embodiment of the present invention.

Moreover, FIGS. 5, 7 and 10 are schematic plan views showing a method for forming a silicon-on-insulator device according to another embodiment of the present invention. FIG. 5 shows a SOI wafer 20 with a plurality of isolated silicon mesas 204a formed thereon. FIG. 7 shows the SOI wafer 20 with a plurality of MOS transistors formed thereon. FIG. 10 shows the SOI wafer 20 with a plurality of MOS transistors covered by an insulating layer 210, having contacts 212 and 214 formed therein according to an embodiment of the present invention. In this embodiment, the contact 212 functions as a substrate contact of the SOI wafer 20 and is formed within an isolation region between two adjacent silicon mesas 204a and the contacts 214 function as source/drain contacts for each of the MOS transistors. The above metal-oxide-semiconductor (MOS) transistors are provided over some silicon mesas 204a illustrated in FIG. 5, each comprising a dielectric layer 206 and a conductive layer 208 sequentially stacked thereover. As shown in FIG. 7, the dielectric layer 208 is not only formed over a top surface of the silicon mesas 204a but also on sidewall surfaces thereof. The conductive layer 208 is formed over some of the silicon mesas 204a, partially covering the dielectric layer 208 from the top and sidewall surfaces thereof, thereby forming fin-shaped transistors of triple gate control over the SOI wafer 20.

Figure 6:
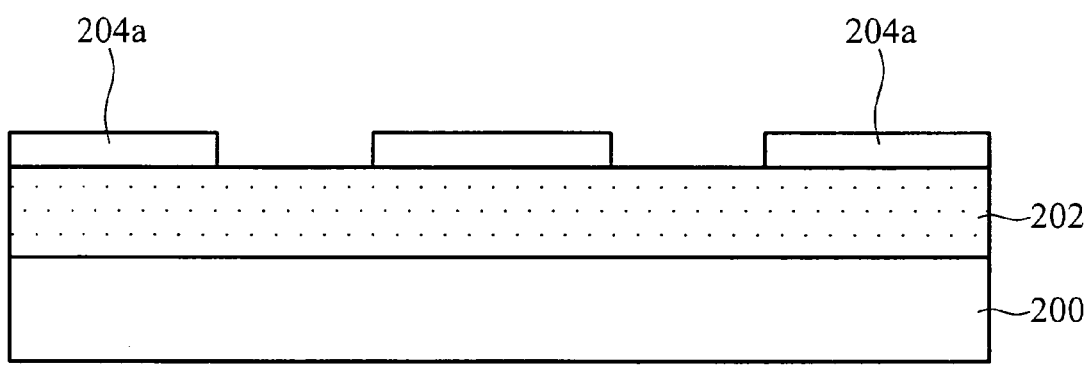
FIG. 6 is a cross-sectional view taken along line 6-6 in FIG. 5, showing fabrication steps for forming the isolated silicon mesas according to an embodiment of the present invention.

The method for forming the silicon-on-insulator (SOI) device according to this exemplary embodiment is further illustrated by the cross-sectional views shown in FIGS. 6, 8-9 and 11. FIG. 6 shows a cross-sectional view taken along line 6-6 in FIG. 5. In FIG. 6, the SOI wafer 20 is formed with a plurality of isolated silicon mesas 204a thereon. Fabrication of the silicon mesas 204a is described as follow. The SOI wafer 20 including an underlying substrate 200, and a silicon layer overlaying a buried insulating layer 202, e.g., a buried oxide layer, is first provided. A layer of masking material (not shown), for example oxide, nitride, or a combination thereof is next formed over the silicon layer. Next, the layer of masking material and the silicon layer are defined by photolithography and sequential etching to form a plurality of first openings and exposing the buried insulating layer 102 therein. Thus, the isolated silicon mesas 204a are formed after removal of the masking material, as shown in FIG. 6.

Figure 8:
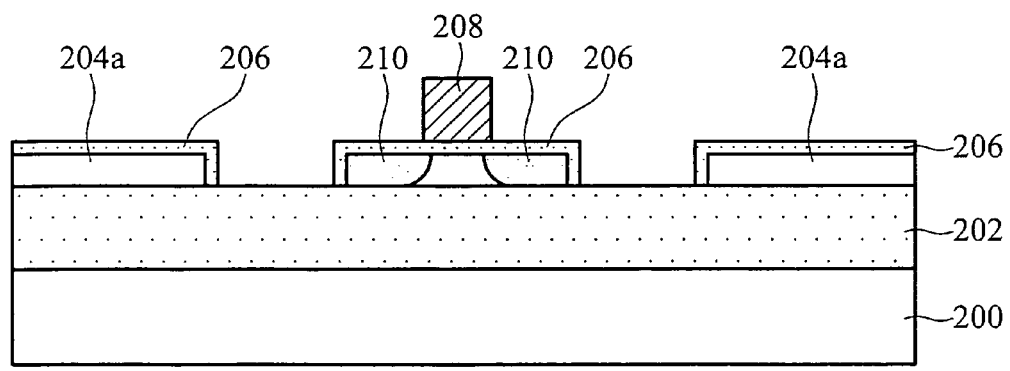
FIGS. 8-9 are cross-sectional views taken along lines 8-8 and 9-9 in FIG. 7, showing fabrication steps for forming the SOI devices according to an embodiment of the present invention.
Figure 9:
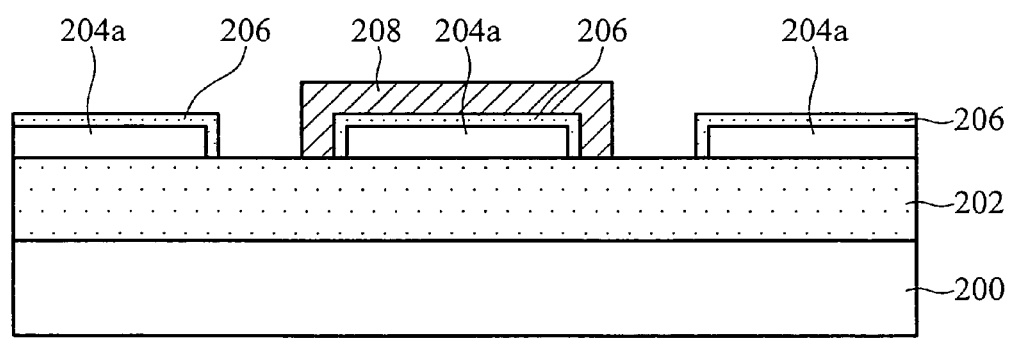

SOI devices, such as the MOS transistor, can be then fabricated on some of the isolated silicon mesas 204a illustrated in FIG. 5 by conventional semiconductor fabricating techniques, as shown in FIG. 7. FIGS. 8 and 9 show schematic cross-section views taken along lines 8-8 and 9-9 in FIG. 7, respectively. As shown in FIG. 8, the MOS transistor is formed over one of the silicon mesas 204a, including the dielectric layer 206 covering the silicon mesa 204a thereunder. The conductive layer 208 is formed over a portion of the dielectric layer 206. Source/drain regions 210 are formed in portions of one of the silicon mesa 204a, thereby functioning as an SOI device. Herein, the dielectric layer 206 covers the silicon mesas 204a from the top and sidewalls surfaces thereof. FIG. 9 is a cross section showing the MOS transistor from a different viewing angle. As shown in FIG. 9, the conductive layer 208 covers the dielectric layer 206 from three sides of the silicon mesa 204a, thereby forming a triple-gate MOS transistor. Materials of the dielectric layer 206 can be, for example, silicon dioxide or high dielectric constant material and the conductive layer 208 can be, for example, doped polysilicon.

Figure 11:
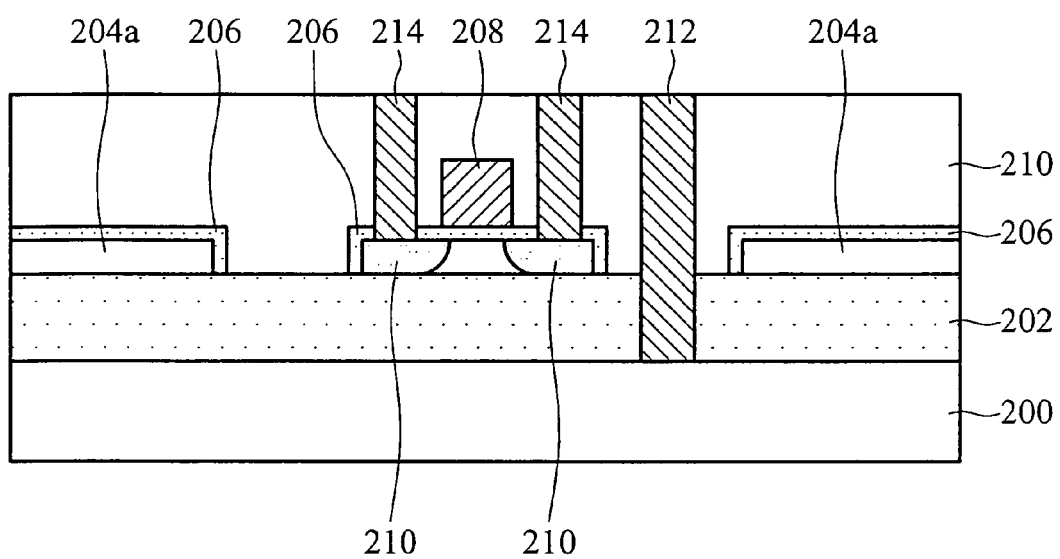
FIG. 11 is a cross-sectional view taken along lines 11-11 in FIG. 10, showing fabrication steps for forming the front side substrate contact according to an embodiment of the present invention.

Next, the insulating layer 210 is blanketly formed over the structures of the SOI wafer 20 shown in FIGS. 7-9 and fills the spacing between the silicon mesas 204a, thereby providing a substantially planar surface. The contacts 212 and 214 are next formed over the SOI wafer 20 and locate at proper locations, as shown in FIG. 10. FIG. 11 shows a cross section taken along the line 11-11 illustrated in FIG. 10. Herein, referring to FIGS. 10 and 11, the contact 212 locates at a place between two adjacent silicon mesas 204a and is formed through the insulating layer 210 and the buried insulating layer 202, thereby functioning as a substrate contact downward to the underlying substrate 200. The contacts 214 locate at a place substantially over the source/drain regions 210, respectively, and are formed through the insulating layer 210 and the dielectric layer 206, thereby functioning as source/drain contacts. The contact 212 now functions as a front side substrate and may further electrically contact with a conductive wire (not shown) subsequently formed in the upper level for providing voltages for grounding or biasing the underlying substrate 200. Materials of the contacts 212 and 214 can be conductive materials such as metal or doped polysilicon and preferably be metal such as tungsten or the like.

The above exemplary embodiments of the present invention provides a methods for forming SOI devices a silicon-on-insulator (SOI) wafer incorporating formation of substrate contacts from the front side thereof. The above methods for forming SOI devices are integrated processes for fabricating SOI devices without additional wafer processing after wafer dicing. Therefore, many of the more advanced packaging technologies, e.g., such as flip chip and die stacking, can directly make a contact to an underlying substrate via the front of the diced SOI wafer.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for forming a substrate contact on a silicon-on-insulator (SOI) wafer, comprising:
   providing a SOI wafer with a mask layer thereon, wherein the SOI wafer includes an underlying substrate, and a silicon layer overlaying a buried insulating layer;
   forming an isolation region through the mask layer and the silicon layer, wherein the isolation region is substantially coplanar with a top surface of the mask layer;
   forming a contact opening through a central portion of the isolation region and the buried insulating layer thereunder to expose a part of the underlying substrate;
   forming a contact plug in the contact opening to electrically connect the underlying substrate, wherein the contact plug is surrounded by the isolation region and the buried insulating layer and physically in connection with the isolation region and the buried insulating layer, and has a top surface coplanar with that of the isolation region; and
   removing the mask layer to form a plurality of isolated silicon mesas after formation of the contact plug, wherein a top surface of the plurality of isolated silicon mesas is exposed and lower than that of the isolation region.

2. The method of claim 1, further comprising a step of forming a doped region in the portion of the underlying substrate exposed by the contact opening prior to the formation of the contact plug.

3. The method of claim 2, wherein the contact plug directly contacts the doped region.

4. The method of claim 2, wherein the doped region and the underlying substrate are doped with the same dopants.

5. The method of claim 1, wherein the contact opening has an aspect ratio of approximately 20:1 to 3:1.

6. The method of claim 1, wherein the contact plug includes doped polysilicon.

7. The method of claim 1, wherein the formation of the contact opening is performed by dry etching utilizing etchants containing at least one of N2, H2, and F based materials.

8. The method of claim 1, wherein the removal of the mask layer is performed by wet etching.

9. A method for forming a silicon-on-insulator (SOI) device, comprising:
   providing a SOI wafer with a mask layer thereon, wherein the SOI wafer includes an underlying substrate and a silicon layer overlaying a buried insulating layer;
   defining the mask layer and the silicon layer to form a plurality of first openings exposing the buried insulating layer therein, thereby forming a plurality of isolated silicon mesas over the SOI wafer;
   forming an insulating layer in the first openings, wherein a top surface of the insulating layer is coplanar with that of the mask layer;
   defining a central region of the insulating layer and the buried insulating layer thereunder, thereby form a second opening exposing a part of the underlying substrate;
   forming a conductive plug in the second opening to electrically contact the underlying substrate, wherein the conductive plug is surrounded by the buried insulating layer and the insulating layer;
   removing the mask layer and exposing the isolated silicon mesas after formation of the conductive plug, wherein the isolated silicon mesas have a top surface lower than that of the insulating layer, respectively;
   forming a dielectric layer over each of the isolated silicon mesas, wherein the dielectric layer has a top surface lower than that of the insulating layer;
   forming a conductive layer over at least one of the isolated silicon mesas, partially covering the dielectric layer; and
   forming a pair of source/drain regions in the at least one of the isolated silicon mesas covered by the conductive layer, wherein the source/drain regions are formed on opposite sides of the conductive layer.

10. The method of claim 9, further comprising a step of forming a doped region in the underlying substrate prior to formation of the conductive plug, wherein the doped regions is exposed by the second opening prior to the formation of the conductive plug.

11. The method of claim 9, wherein the conductive plug directly contacts the doped region.

12. The method of claim 9, wherein the doped region and the underlying substrate are doped with the same dopants.

13. The method of claim 9, wherein the second opening has an aspect ratio of approximately 20:1 to 3:1.

14. The method of claim 9, wherein the conductive plug includes doped polysilicon.

15. The method of claim 9, wherein the formation of the second opening is performed by dry etching utilizing etchants containing at least one of N2, H2 and F based materials.

16. The method of claim 9, wherein removal of the mask layer is performed by wet etching.

17. The method of claim 9, wherein the conductive plug is formed prior to formation of the conductive layer over the isolated silicon mesa.

18. A method for forming a silicon-on-insulator (SOI) device, comprising:
   providing a SOI wafer, wherein the SOI wafer includes an underlying substrate and a silicon layer overlaying a buried insulating layer;
   defining the silicon layer into a plurality of isolated silicon mesas, leaving a gap between every two adjacent isolated silicon mesas:
   forming a dielectric layer over each of the isolated silicon mesas, covering and physically contacting top and sidewall surfaces thereof;
   forming a conductive layer over at least one of the isolated silicon mesas, partially covering the dielectric layer from top and sidewall surface thereof;
   forming a pair of source/drain regions in one of the isolated silicon mesa not covered by the conductive layer, thereby forming a transistor;
   blanketly forming an insulating layer over the SOI wafer, covering the transistor and gaps between the isolated silicon mesas;
   forming an first opening in the insulating layer, wherein the first opening substantially aligns to one of the gaps between the isolated silicon mesas and forms through the buried insulating layer thereunder, thereby exposing the underlying substrate therein; and
   forming a conductive plug in the first opening to electrically contact the underlying substrate, wherein the conductive plug is surrounded by the buried insulating layer and the insulating layer.

19. The method of claim 18, wherein the conductive plug includes doped polysilicon.

20. The method of claim 18, wherein the transistor is a triple-gate transistor.

21. The method of claim 18, wherein during formation of the first opening in the insulating layer, a plurality of second openings are simultaneously formed in the insulating layer and the dielectric layer, wherein the second openings respectively align to one of the source/drain regions of the transistor and thereby expose the underlying source/drain regions.

22. The method of claim 21, wherein during formation of the forming a conductive plug in the first opening to electrically contact the underlying substrate, a plurality of conductive contacts are simultaneously formed in the second openings to electrically contact the source/drain regions, wherein the conductive contacts are surrounded by the insulating layer and the dielectric layer.

* * * * *